(12) United States Patent
Tonari (10) Patent No.: US 8,710,624 B2
(45) Date of Patent: Apr. 29, 2014

(54) SEMICONDUCTOR DEVICE

(71) Applicant: Elpida Memory, Inc., Tokyo (JP)

(72) Inventor: Kazuaki Tonari, Tokyo (JP)

(*) Notice: Subject to any disclaimer, the term of this patent is extended or adjusted under 35 U.S.C. 154(b) by 0 days.

(21) Appl. No.: 13/716,966

(22) Filed: Dec. 17, 2012

(65) Prior Publication Data

US 2013/0154056 A1 Jun. 20, 2013

(30) Foreign Application Priority Data

Dec. 16, 2011 (JP) ................................. 2011-275943

(51) Int. Cl.
*H01L 29/00* (2006.01)

(52) U.S. Cl.
USPC .................................. 257/532; 257/E27.024

(58) Field of Classification Search
USPC .......................................... 257/532, E27.024
See application file for complete search history.

(56) References Cited

U.S. PATENT DOCUMENTS

| | | | |
|---|---|---|---|
| 6,584,566 B1 | 6/2003 | Hardjono | |
| 6,813,714 B1 | 11/2004 | Hardjono et al. | |
| 7,945,272 B2 | 5/2011 | Kim | |
| 2003/0027380 A1* | 2/2003 | Yamazaki | 438/151 |
| 2003/0044020 A1 | 3/2003 | Aboba et al. | |
| 2003/0177267 A1 | 9/2003 | Orava et al. | |
| 2006/0063548 A1 | 3/2006 | Kim | |
| 2006/0267019 A1 | 11/2006 | Kim et al. | |
| 2007/0071021 A1 | 3/2007 | Girao | |
| 2009/0024848 A1 | 1/2009 | Takasugi et al. | |
| 2010/0011063 A1 | 1/2010 | Blaiotta et al. | |
| 2011/0072121 A1 | 3/2011 | Takasugi et al. | |

FOREIGN PATENT DOCUMENTS

| | | |
|---|---|---|
| JP | 2006-081184 | 3/2006 |
| JP | 2006-339632 | 12/2006 |
| JP | 2007-089156 | 4/2007 |
| JP | 2008-257340 | 10/2008 |
| JP | 2008-543137 | 11/2008 |
| WO | WO2007/072814 | 6/2007 |

* cited by examiner

*Primary Examiner* — David S Blum
(74) *Attorney, Agent, or Firm* — Young & Thompson (57) ABSTRACT

In a semiconductor device including a capacitor which has an upper electrode, a polycrystalline silicon layer on the upper electrode, and a metallic member on the polycrystalline silicon layer, the polycrystalline silicon layer includes germanium so that an upper portion of the polycrystalline silicon layer is lower than a lower portion thereof in a concentration of germanium.

20 Claims, 8 Drawing Sheets

SEMICONDUCTOR DEVICE

This application is based upon and claims the benefit of priority from Japanese patent application No. 2011-275943, filed on Dec. 16, 2011, the disclosure of which is incorporated herein in its entirety by reference.

BACKGROUND OF THE INVENTION

1. Field of the Invention

The present invention relates to a semiconductor device including a capacitor.

2. Description of Related Art

A DRAM (Dynamic Random Access Memory) is a semiconductor memory which generally includes a plurality of memory cells each consisting of a single MOS transistor and a single capacitor. Such a DRAM is incorporated in a wide variety of electronic devices and is widespread.

In Japanese Laid-Open Patent Publication No. 2006-339632, disclosure is made about a capacitor which has a lower metal electrode over a semiconductor substrate, a dielectric film on the lower electrode, and an upper electrode which is laminated on and contacted with the dielectric film and which has a stacked film including a polycrystalline layer of a semiconductor belonging to the fourth group.

The above-mentioned document also discloses a capacitor which has a dielectric film and a stacked film which is formed as an upper electrode by a first thin film of a silicon germanium mixture and a second thin film of silicon and which is contacted with the dielectric film. Herein, the capacitor which uses the upper electrode of a semiconductor material contacted directly with the dielectric film will be called a capacitor of an SIM structure.

Thus, using the upper electrode which has a multiple layer structure including a polycrystalline layer of the fourth group semiconductor material makes it possible to realize a stable structure and to suppress a leak current.

However, the capacitor of the SIM structure which has the upper electrode mentioned in the above-mentioned document is disadvantageous in that resistivity of the upper electrode is high.

As to the DRAM, it is very common that the upper electrode of the capacitor included in each memory cell is commonly connected each other among a plurality of memory cells. Therefore, the upper electrode is formed as a plate-like electrode on a chip. Under the circumstances, when the electrical resistivity of a material forming the upper electrode is high, a local voltage fluctuation is often observed transiently on the plate-like electrode in response to a charge/discharge of the capacitor of the selected one of the memory cells. Such a voltage fluctuation results in a noise on reading data stored in the memory cell and bring about a malfunction.

SUMMARY OF THE INVENTION

According to a first aspect of the present invention, there is provided a semiconductor device comprising a lower electrode formed over a semiconductor substrate, a dielectric film on the lower electrode, an upper electrode on the dielectric film, a polycrystalline silicon layer on the upper electrode, and a metallic member contacted with an upper surface of the polycrystalline silicon layer, wherein a concentration of germanium in an upper portion of the polycrystalline silicon layer is lower than that in a lower portion of the polycrystalline silicon layer.

DETAILED DESCRIPTION OF THE EMBODIMENTS

Now, the description will be described about exemplary embodiments to which this invention is applied with reference to drawings. Drawings used in the following description are for describing configurations of the exemplary embodiments of this invention, and therefore sizes, thicknesses, dimensions, or the like of respective parts illustrated may be different from relationships of actual sizes.

[First Exemplary Embodiment]

Figure 1:
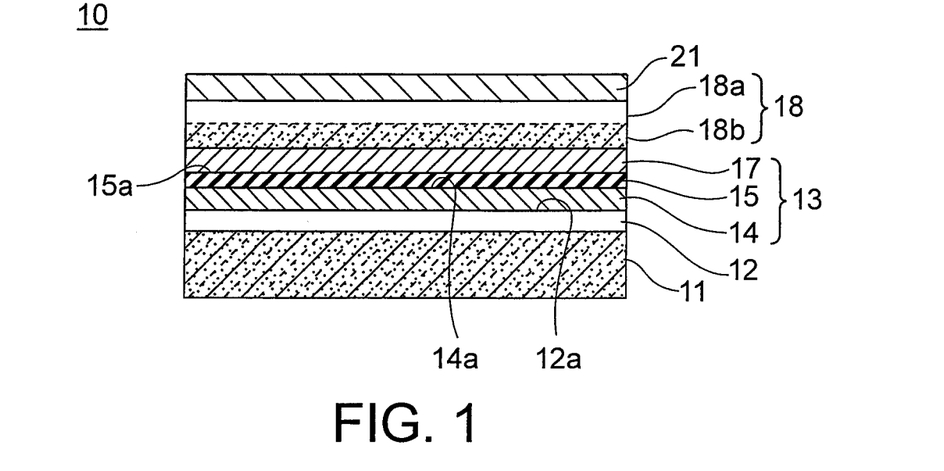
FIG. 1 is a cross sectional view of a semiconductor device according to a first exemplary embodiment of this invention.

FIG. 1 is a cross sectional view of a semiconductor device according to a first exemplary embodiment of this invention.

Referring to FIG. 1, the semiconductor device 10 of the first exemplary embodiment comprises a semiconductor substrate 11, an insulating film 12 formed on the semiconductor substrate 11 and a capacitor 13.

The semiconductor substrate 11 may be, for example, a monocrystalline silicon substrate.

The capacitor 13 is provided on a main surface 12a of the insulating film 12 formed on the semiconductor substrate 11, and comprises a lower electrode 14, a dielectric film 15, and an upper electrode 17.

The lower electrode 14 is provided on the main surface 12a of the insulating film 11 and is made of a conductive material. The lower electrode 14 may be, for example, a titanium nitride film (TiN film).

The conductive material constituting the lower electrode 14 is not limited to the titanium nitride film (TiN film). The conductive material constituting the lower electrode 14 may preferably be a material which has a low reactivity for the dielectric film 15 formed on the lower electrode 14.

The dielectric film 15 includes a metallic oxide film and is provided so as to cover an upper surface 14a of the lower electrode 14. It is desired that the dielectric film 15 is made of a material having a large dielectric constant.

Among metallic oxide films, a zirconium oxide film has a large dielectric constant between 20 and 50 and a relatively large energy band gap (about 6 eV).

Accordingly, the zirconium oxide film has a relatively small leakage current and has excellent electrical properties.

The dielectric film 15 is preferably made of a material selected from a group consisting of a titanium oxide film, a zirconium oxide film, hafnium oxide film, and aluminum oxide film and the dielectric film 15 may use any single layer film made of any one material selected from them or a multilayer film made of at least two materials selected from them. One example of the multilayer film is a structure where the aluminum oxide film having a large energy band gap is sandwiched between the zirconium oxide film and the other zirconium oxide film. These materials have characteristics in which heat resistance is low and electrical properties easily change.

A method of forming the dielectric film 15 is not limited to an ALD method and the dielectric film 15 may be formed using a MOCVD (Metal Organic Chemical Vapor Deposition) method or the like.

The upper electrode 17 is made of a metallic material which covers an upper surface 15a of the dielectric film 15. The metallic material constituting the upper electrode 17 may be, for example, a titanium nitride film (TiN film). On the upper electrode 17, a structure where a polycrystalline silicon film 18 containing germanium and a metallic film 21 are stacked in order is provided. Herein, the polycrystalline silicon film 18 has a characteristic in which it is not made of an amorphous silicon film but is made of a polycrystalline film and a low electrical resistance film is used as it. The polycrystalline silicon film 18 containing germanium comprises an upper portion 18a and a lower portion 18b. The upper portion 18a in proximity to an top surface of the polycrystalline silicon film 18 has concentration of germanium that is lower than that of the lower portion 18b in proximity of a bottom surface of the polycrystalline silicon film 18. The concentration of germanium in the lower portion 18b in proximity to the bottom surface of the polycrystalline silicon film 18 is required to have a predetermine concentration in order to deposit the polycrystalline silicon at a low temperature of, for example, 450° C. or less. In an unpreferable case that the metallic film is directly formed on the polycrystalline silicon containing germanium having the predetermined concentration, the metallic film often peels off. It is possible to prevent the metallic film from peeling off by reducing the concentration of germanium in the upper portion 18a in proximity to the top surface of the polycrystalline silicon film 18. A profile of the concentration of germanium in a thickness direction of the polycrystalline silicon film 18 may continuously change toward the top surface or may stepwise change. The concentration of germanium in proximity to the top surface of the polycrystalline silicon film 18 may be 0%.

Tungsten may be used as a metallic material of the metallic film 21. In addition, a barrier metal, which is generally used as a lower layer of tungsten, may be laminated. Although the metallic film 21 is formed in a plate-like so as to cover the polycrystalline silicon film 18 in the example illustrated in FIG. 1, a plurality of island-like metallic films distributed to each other may be formed. In this event, the metallic films include contact plugs each of made of metallic material.

The polycrystalline silicon film 18 contains impurities (dopants) such as boron and has a sufficiently low electrical resistivity. Under the circumstances, it is possible to obtain a low electrical resistance film by causing the lower portion 18b in proximity to the bottom surface of the polycrystalline silicon film 18 to contain germanium having a sufficiently high concentration and to contain the impurities such as boron. On forming the polycrystalline silicon film containing germanium at the low temperature, the impurities are sufficiently activated together with deposition.

In the manner which is described above, by using the polycrystalline silicon film containing germanium so that it is possible to obtain the polycrystalline silicon film having a relatively low electrical resistance at the low temperature (e.g. within a range between 380° C. and 450° C.), it is possible to suppress degradation of the dielectric film 15 in comparison with a case where the upper electrode 17 is configured with a single layer of a polycrystalline silicon film which is required to deposit at a high temperature, and it is therefore possible to obtain a dielectric film having a high dielectric constant so as to suppress the occurrence of a leakage current.

On providing the metallic film 21 on the polycrystalline silicon film 18 containing germanium, by reducing the concentration of germanium in the upper portion 18a in proximity to the top surface of the polycrystalline silicon film 18 containing than the concentration of germanium in a lower portion of the polycrystalline silicon film 18 containing germanium, it is possible to lower the electrical resistance of the upper electrode 17 in a state where it prevents the metallic film 21 from peeling off the polycrystalline silicon film 18 containing germanium.

It is preferable that a thickness of the polycrystalline silicon film 18 containing germanium is 20 nm or more. In the manner which is described above, by setting the thickness of the polycrystalline silicon film 18 containing germanium to 20 nm or more, it is possible to prevent the metallic film 21 from peeling off by thermally diffusing germanium with a high concentration contained in the lower portion of the polycrystalline silicon film 18 containing germanium up to proximity to the top surface of the polycrystalline silicon film 18 containing germanium.

According to the semiconductor device of the first exemplary embodiment, by configuring a structure where the upper electrode 17 made of the metallic material, the polycrystalline silicon film 18 containing germanium, the metallic film 21 are stacked on the dielectric film 15 in order, it is possible to suppress the degradation of dielectric film 15 because the polycrystalline silicon film 18 containing germanium comprises a film which can be deposited at the low temperature (e.g. within a range between 380° C. and 450° C.). It is therefore possible to obtain the dielectric film 15 which has a low leakage current and has a high dielectric constant. And, by lowering the concentration of germanium in upper portion of the polycrystalline silicon in proximity to the top surface of the polycrystalline silicon film 18 containing germanium than the concentration thereof in the lower portion of the polycrystalline silicon film 18 containing germanium, it is possible to lower the electrical resistance of the upper electrode 17 under a condition where it prevents the metallic film 12 from peeling off.

FIGS. 2 to 5 are cross sectional views showing a manufacturing method of the semiconductor device according to the first exemplary embodiment of this invention. In FIGS. 2 to 5, the same signs are designated with components similar to those in the semiconductor device 10 of the first exemplary embodiment illustrated in FIG. 1.

Referring now to FIGS. 2 to 5, the description will proceed to the manufacturing method of the semiconductor device 10 of the first exemplary embodiment (specifically speaking, a forming method of the capacitor 13 illustrated in FIG. 1).

Figure 2:
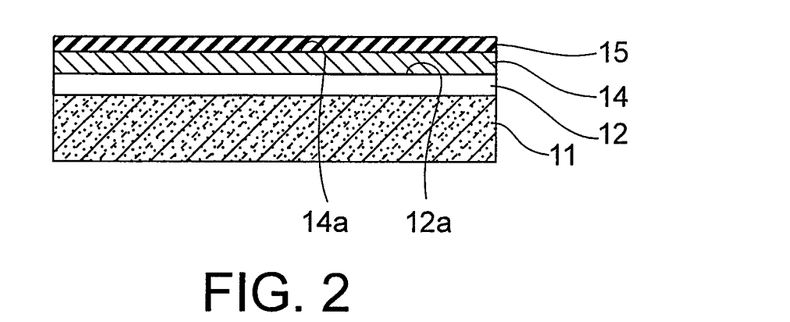
FIG. 2 is a cross sectional view showing a first step of a manufacturing process of the semiconductor device according to the first exemplary embodiment of this invention.

First, a process illustrated in FIG. 2 deposits a titanium nitride film (TiN film) on an insulating film 12 formed on a semiconductor substrate 11 to form a lower electrode 14.

More specifically, the process illustrated in FIG. 2 deposits the above-mentioned titanium nitride film (TiN film) by using a vapor deposition method such as an ALD (Atomic Layer Deposition) method or a CVD (Chemical Vapor Deposition) method.

Subsequently, the process illustrated in FIG. 2 forms a dielectric film 15 containing metallic oxide so as to cover an upper surface of the lower electrode 14. More specifically, the process illustrated in FIG. 2 forms by using the vapor deposition method such as the ALD method or the CVD method, as the dielectric film 15, a single layer film of any one selected from a group consisting of a titanium oxide film, a zirconium oxide film, a hafnium oxide film, and an aluminum oxide film all of which are made of the metallic oxide or a multilayer film of them.

Figure 3:
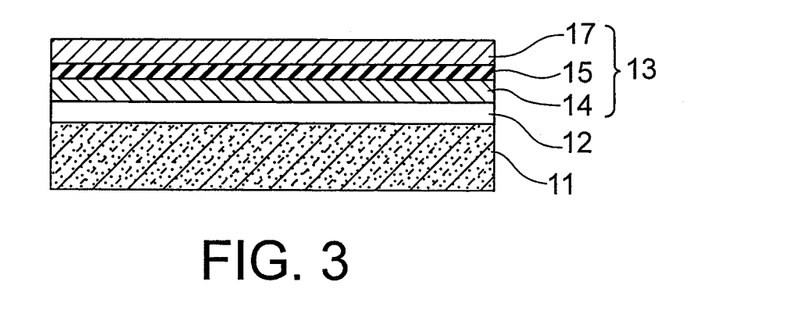
FIG. 3 is a cross sectional view showing a second step of the manufacturing process of the semiconductor device according to the first exemplary embodiment of this invention.

Next, a process illustrated in FIG. 3 forms an upper electrode 17 made of a metallic material to cover an upper surface of the dielectric film 15 by means of the CVD method or the ALD method which are the vapor deposition method having an excellent step coverage.

Figure 4:
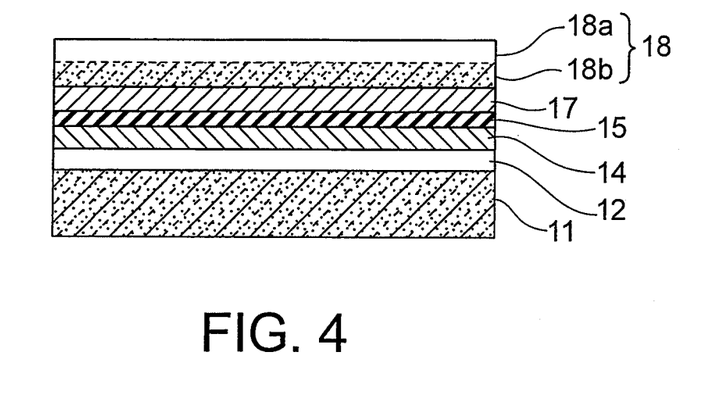
FIG. 4 is a cross sectional view showing a third step of the manufacturing process of the semiconductor device according to the first exemplary embodiment of this invention.

Next, a process illustrated in FIG. 4 forms, by the vapor deposition method, a polycrystalline silicon film 18 containing germanium at a deposition temperature of low temperature (e.g. a predetermined temperature within a range between 380° C. and 450° C.).

Specifically, the process illustrated in FIG. 4 forms the polycrystalline silicon film 18 containing germanium at the following conditions and methods by means of, for example, an LP-CVD apparatus.

First, a semiconductor substrate that has a structure illustrated in FIG. 3 is loaded into a chamber of the LP-CVP apparatus and thereafter a pressure in the chamber is held to 40 Pa and temperature in the chamber is held to 450° C.

Subsequently, $SiH_4$ (having a flow rate of 787.5 ccm), $BCl_3$ (having a flow rate of 3.15 ccm), and $GeH_4$ (having a flow rate of 735 ccm) are introduced in the chamber as process gases to cause a reaction to occur, thereby deposition of the boron-doped polycrystalline silicon film 18 containing germanium poly-crystallized starts. Usually, an amorphous film is deposited under a condition of low temperature and the polycrystalline silicon film cannot be obtained without a condition of high temperature of 600° C. or more. However, by setting the flow rate of $GeH_4$ to a predetermined value or more, it is possible to obtain poly-crystallized silicon film under a condition of low temperature. On depositing the polycrystalline silicon film 18 containing germanium, by introducing gas containing boron in the chamber at the same time, it is possible to obtain the polycrystalline silicon film having a low electrical resistance that contains boron which is activated under the condition of low temperature. In an unpreferable case that impurities are introduced in the polycrystalline silicon film by means of an ion implantation method after the polycrystalline silicon film is formed, heat treatment at high temperature to activate the impurities is required to obtain the polycrystalline silicon film having low electrical resistance.

Subsequently, among the above-mentioned process gases, by controlling the amount of supply of $GeH_4$ (however, supply of $SiH_4$ (having the flow rate of 787.5 ccm) and $BCl_3$ (having the flow rate of 3.15 ccm) is maintained), it is possible to control the profile of concentration of germanium in a thickness direction of the polycrystalline silicon film 18 containing germanium. By lowering the amount of supply of $GeH_4$, it is possible to lower the concentration of germanium of an upper portion of the polycrystalline silicon film 18 containing germanium. In a case where supply of GeH4 stops, it is possible to make the concentration of germanium of the upper portion of the polycrystalline silicon film 18 zero. Although the amount of supply of $GeH_4$ changes, it is possible to continuously deposit the polycrystalline silicon film with low electrical resistance containing boron activated under the condition of low temperature without making amorphous.

By making such a manner, it is possible to form the polycrystalline silicon film with low electrical resistance containing activated boron without using a process under a condition of high temperature that becomes a cause of degradation of the dielectric film 15.

Figure 5:
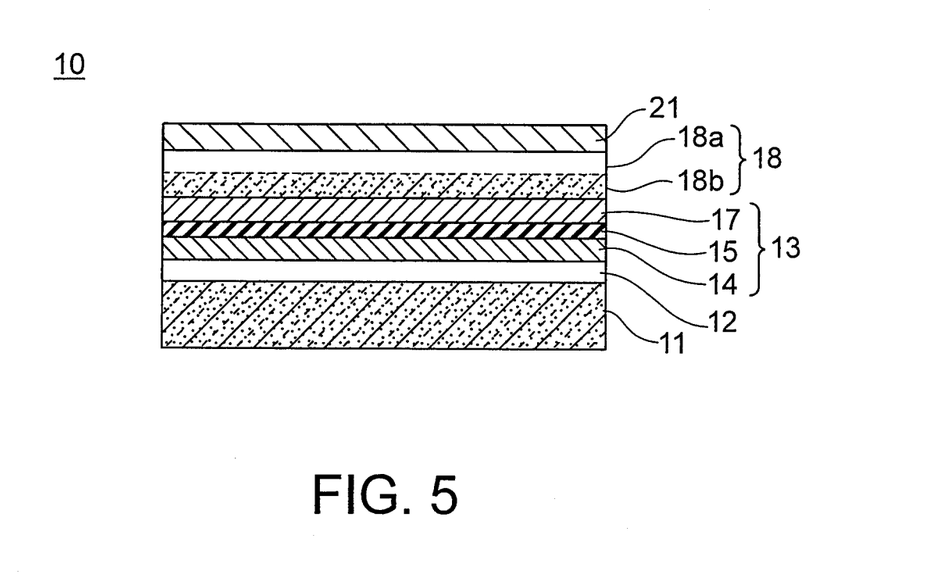
FIG. 5 is a cross sectional view showing a fourth step of the manufacturing process of the semiconductor device according to the first exemplary embodiment of this invention.

Next, a process illustrated in FIG. 5 forms, by the vapor deposition method (e.g. the CVD method), a metallic film 21 made of tungsten on the polycrystalline silicon film 18 containing germanium.

Therefore, it is possible to obtain a structure where the upper electrode 17 made of the metallic material, the polycrystalline silicon film 18 containing germanium, and the metallic film 21 are stacked on the dielectric film 15 in order.

According to the manufacturing method of the semiconductor device of the first exemplary embodiment, on forming the upper electrode 17 made of the metallic material on the dielectric film 15, and subsequently on depositing the polycrystalline silicon film with low electrical resistance containing germanium and activated boron at the deposition temperature of low temperature (the predetermined temperature within the range between 380° C. and 450° C.), it is possible to reduce the germanium concentration in the upper portion of the polycrystalline silicon film in proximity to the top surface of the polycrystalline silicon film by reducing the amount of supply of the gases containing atoms of germanium. By forming the metallic film on the polycrystalline silicon film, it is possible to reduce the leakage current of the capacitor 13 and it is possible to lower the electrical resistance of the upper electrode 17 in the state where it prevents the metallic film 21 from peeling off the polycrystalline silicon film 18 containing germanium.

[Second Exemplary Embodiment]

Figure 6:
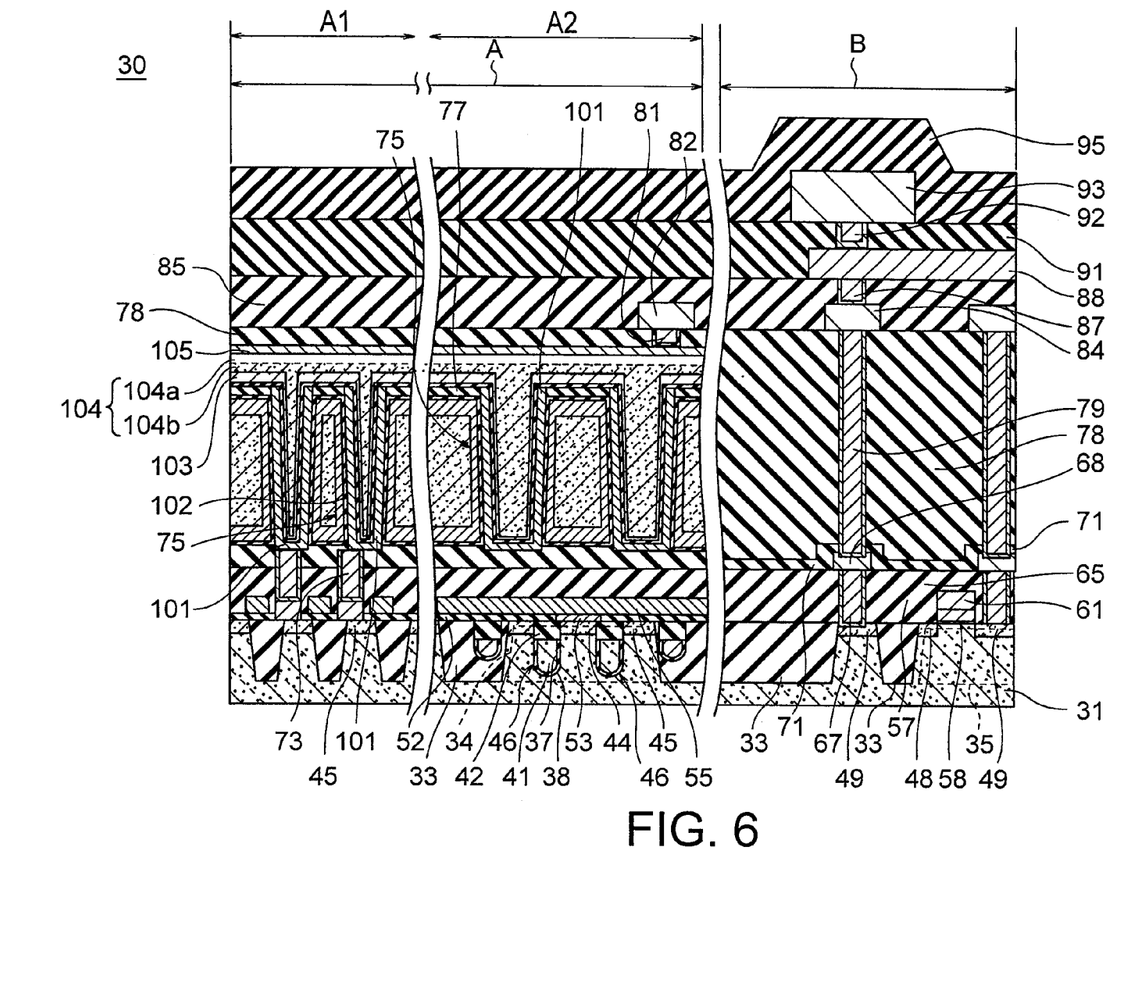
FIG. 6 is a cross sectional view of a semiconductor device according to a second exemplary embodiment of this invention.

FIG. 6 is a cross sectional view of a semiconductor device according to a second exemplary embodiment of this invention. FIG. 6 illustrates a DRAM as an example of the semiconductor device 30 according to the second exemplary embodiment.

Referring to FIG. 6, the semiconductor device 30 of the second exemplary embodiment comprises a memory cell area A in which a plurality of memory cells are arranged and a peripheral circuit area B configuring a sense amplifier, a word line driving circuit, a control signal generating circuit, and so on. In addition, A1 shows a cross sectional view of the memory cell area A in a direction perpendicular to bit lines thereof while A2 shows a cross sectional view of the memory cell area A in a direction parallel to the bit lines thereof.

Now, the description will proceed to the peripheral circuit area B of FIG. 6 in brief.

An element isolation region 33 is formed on a p-type monocrystalline silicon substrate 31 and an active region 35 is formed. The element isolation region 33 is configured by burying an insulating material such as a silicon oxide film, a silicon nitride in a trench formed in the silicon substrate. On the active region 35 of the silicon substrate 31, a gate electrode 61 is formed via a gate insulating film 58. In addition, n-type impurity diffused layers 48 and 49 are formed in the active region 35 of the silicon substrate 31 adjacent to the gate electrode 61 to form a source region and a drain region. The gate electrode 61 in conjunction with the source and drain regions constitute an MOS transistor configuring with a peripheral circuit. The gate electrode is configured with a stacked film comprising a polycrystalline silicon layer containing impurities and a metallic layer. The n-type impurity diffused layer 49 is connected to a first wiring layer 68 formed on a first insulating film 65 via a first contact plug 67 formed in the first insulating film 65 and is further connected to a second wiring layer 84 formed on a second interlayer insulating film 78 via a second contact plug 79 formed so as to penetrate an etching stopper film 71 and the second interlayer insulating film 78. Furthermore, the second wiring layer 84 is connected to a third wiring layer 88 via a third contact plug 87 formed in a third interlayer insulating film 85 and is further connected to a fourth wiring layer 93 via a fourth contact plug 92 formed in a fourth interlayer insulating film 91. A protection film 95 is formed on the fourth wiring layer 93. Barrier layers are formed to the respective contact plugs as necessary. The respective wiring layers connect between a plurality of elements (not shown) constituting the peripheral circuit to configure with the peripheral circuit.

Now, the description will proceed to the memory cell area A in FIG. 6.

Each memory cell comprises a cell transistor 46 and a capacitor 75.

In the manner similar to the peripheral circuit area B, an element isolation region 33 is formed on the p-type monocrystalline silicon substrate 31 and an active region 34 is formed.

A cell transistor 46 comprises an imbedded gate electrode 41, a source region, and a drain region. The embedded gate electrode 41 is embedded in a trench formed in the active region 34 on the silicon substrate 31 and is formed via a gate insulating film 38. The source and the drain regions comprise n-type impurity diffused layers 44 and 45 which are formed in the active region 34 adjacent to the trench. The embedded gate electrode 41 extends in one direction and comprises a word line. A cap insulating film 42 is embedded in a concave portion on the embedded gate electrode 41. The n-type impurity diffused layer 45, which is composed of one of the source and drain regions of the cell transistor 46, is connected to a lower electrode 101 of a capacitor 75 via a storage node contact plug 73 to configure a storage node. The storage node contact plug 73 comprises a stacked structure which comprises a polycrystalline silicon layer constituting a lower portion and a metallic layer made of tungsten constituting an upper portion. The n-type impurity diffused layer 44, which is composed of another of the source and drain regions of the cell transistor 46, is connected to a bit line 55 via a bit contact plug 53 formed in a bit interlayer insulating film 52. The bit line 55 extends in a direction perpendicular to a direction in which the imbedded gate electrode configuring the word line extends.

The capacitor 75 is formed over the first insulating film 65 covering the bit line 55 and over the etching stopper film 71. The capacitor 75 comprises a lower electrode 101 having a cylinder shape, a dielectric film 102, and an upper electrode 103. A support film 77 connects between the lower electrodes 101 of adjacent memory cells. The support film 77 has opening portions (not shown) in a part.

The lower electrode 101 may be, for example, a titanium nitride film (TiN film).

A conductive material constituting the lower electrode 101 is not limited to the titanium nitride film (TiN film). The conductive material constituting the lower electrode 101 preferably comprises a material which has a low reactivity for the dielectric film 102 formed on the lower electrode 101.

The dielectric film 102 includes a metallic oxide film and is provided so as to cover a main surface of the lower electrode 101. A material having a large dielectric constant is required as the dielectric film 102.

Among the above-mentioned oxide film, a zirconium oxide film has a large dielectric constant of 20 to 50 and has a relatively large energy band gap (about 6 eV).

Accordingly, the zirconium oxide film has excellent electrical properties because a leakage current is relatively small.

A preferable material as the dielectric film 102 is selected from a group consisting of a titanium oxide film, a zirconium oxide film, a hafnium oxide film, and an aluminum oxide film. The dielectric film 102 may use a single-layer film comprising any one material selected from them or a stacked film comprising at least two materials selected from them. One example of the stacked film is a structure in which the aluminum oxide film having a large energy band gap is sandwiched between the zirconium oxide film and the other zirconium oxide film. These materials have a characteristic which has a weak heat resistance and is easy to be degraded for its electrical properties.

A method of forming the dielectric film 102 is not limited to an ALD method and the dielectric film 102 may be formed by means of a MOCVD (Metal Organic Chemical Vapor Deposition) method or the like.

The upper electrode 103 is made of a metallic material which covers a main surface of the dielectric film 102. The metallic material constituting the upper electrode 103 may use, for example, a titanium nitride film (TiN film). On the upper electrode 103, a structure where a polycrystalline silicon film 104 containing germanium and a metallic film 105 are stacked in order is provided. It is noted that the polycrystalline silicon film 104 has a characteristic so that it is not an amorphous silicon film but is a polycrystalline film, and a low electrical resistance film is used as the polycrystalline silicon film 104. The polycrystalline silicon film 104 containing germanium comprises an upper portion 104a in proximity to a top surface of the polycrystalline silicon film 104 and a lower portion 104b in proximity of a bottom surface of the polycrystalline silicon film 104. The upper portion 104a has a concentration of germanium which is lower than that of the lower portion 104b. The concentration of germanium in the lower portion 104b in proximity to the bottom surface of the polycrystalline silicon film 104 requires a predetermine concentration in order to deposit the polycrystalline silicon film at low temperature of, for example, 450° C. In an unpreferable case that a metallic material is directly formed on the polycrystalline silicon containing germanium having the predetermined concentration, the metallic material is often peeled off. By reducing the concentration of germanium in the upper portion 104a in proximity to the top surface of the polycrystalline silicon film 104, it is possible to prevent the metallic material from peeling off. A profile of the concentration of germanium of the polycrystalline silicon film 104 may continuously change towards the top surface or may change stepwise. The concentration of germanium in the upper portion in proximity to the top surface of the polycrystalline silicon film 104 may be 0%. The polycrystalline silicon film 104 contains an impurity (dopant) such as boron and therefore has a sufficiently low electrical resistivity. Under the circumstances, it is possible to obtain a low electrical resistance film by making the lower portion 104b in proximity to the bottom surface of the polycrystalline silicon film 104 contain germanium having a sufficiently high concentration and contain the impurity such as boron. On forming the polycrystalline silicon film containing germanium at the low temperature, the impurity is sufficiently activated in conjunction with deposition.

In the second exemplary embodiment, inasmuch as the concave portion having an extremely small opening diameter, an extremely deep depth, and an extremely large aspect ratio is formed on the upper electrode 103, in a case that a metallic layer having a low electrical resistance is directly formed on the upper electrode 103, it becomes an issue because it is difficult to fill the metallic layer in the above-mentioned concave portion. The polycrystalline silicon film is suitable for depositing it in the above-mentioned concave portion having the large aspect ratio. The polycrystalline silicon film 104 is filled in the concave portion in a central portion of the capacitor 75 and the upper surface of the polycrystalline silicon film 104 becomes substantially flatness. It is therefore possible to easily form a metallic film 105 on the polycrystalline silicon film 104.

A shape of the lower electrode 101 is preferably a shape so that a width in a plane cross section of an upper end portion of the lower electrode 101 is larger than the width in a plane cross section of a bottom end portion thereof. It is therefore advantageous in that it is possible to avoid forming voids on filling the above-mentioned concave portion. It is further desirable that the shape of the lower electrode 101 is a shape so that the width in the plane cross section of the lower electrode 101 simply increases from the bottom end portion toward the top end portion of the lower electrode.

A metallic material constituting the metallic film 105 may be tungsten. A barrier metal generally used may be laminated as a lower layer of tungsten. Although the metallic film 105 is formed in a plate shape so as to cover the polycrystalline silicon film 104 in the example being illustrated in FIG. 6, a plurality of island-like metallic films dispersed to one another may be formed. In this event, the semiconductor device includes contact plugs each made of metallic material.

Inasmuch as the semiconductor device uses the polycrystalline silicon film containing germanium so that it is possible to obtain the polycrystalline silicon film having the relatively small electrical resistance at low temperature (e.g. within a range between 380° C. and 450° C.) in the manner which is described above, it is possible to obtain a dielectric film having a high dielectric constant to prevent the leakage current from occurring because it is possible to suppress degradation of the dielectric film 102 in comparison with a case where the upper electrode 103 is configured with a single layer of the polycrystalline silicon film that is required to deposit at high temperature. In addition, it is advantageous in that the polycrystalline silicon film is filled in the concave portion having the high aspect ratio to obtain substantially flat surface on forming the metallic material having the low electrical resistance thereon.

In addition, by reducing the concentration of germanium in the upper portion in proximity to the top surface of the polycrystalline silicon film 104 containing germanium than the concentration of germanium in the lower portion in proximity to the bottom surface of the polycrystalline silicon film 104 containing germanium on forming the metallic film 105 on the polycrystalline silicon film 104 containing germanium, it is possible to reduce the electrical resistance of the upper electrode 103 in the state where it prevents the metallic film 105 from peeling off the polycrystalline silicon film 104 containing germanium.

It is desirable that a thickness of the polycrystalline silicon film 104 containing germanium is 20 nm or more. In the manner which is described above, by setting the thickness of the polycrystalline silicon film 104 containing germanium in 20 nm or more, it is possible to prevent the metallic film 105 from peeling off by thermally diffusing germanium having the high concentration included in the lower portion of the polycrystalline silicon film 104 containing germanium up to the upper portion of the polycrystalline silicon film 104 containing germanium.

According to the semiconductor device of the second exemplary embodiment, by forming, on the dielectric film 102, the structure in which the upper electrode 103 made of the metallic material, the polycrystalline silicon film 104 containing germanium, and the metallic film 105 are stacked in order, it is possible to suppress degradation of the dielectric film 102 because the polycrystalline silicon film 104 comprises the film which can deposit at low temperature (e.g. within the range between 380° C. and 450° C.) and it is therefore possible to obtain the dielectric film 102 having the high dielectric constant so that the leakage current is small. And, by reducing the concentration of germanium in proximity to the upper surface of the polycrystalline silicon film 104 containing germanium than the concentration of germanium of the lower portion of the polycrystalline silicon film 104 containing germanium, it is possible to reduce the electrical resistance of the upper electrode 103 in the state where it prevents the metallic film 105 from peeling off.

A second interlayer insulating film 78 is formed on a main surface of the metallic film 105. A contact plug 81 is formed in the second interlayer insulating film 78 and is electrically connected to a wiring layer 82 formed on the second interlayer insulating film 78. The third interlayer insulating film 85, the fourth interlayer insulating film 91, and the protection film 95 are stacked on the wiring layer 82, Referring now FIGS. 7 to 10, the description will proceed to a manufacturing method of the semiconductor device 30 of the second exemplary embodiment.

FIGS. 7 to 10 are cross sectional views showing a manufacturing process of the semiconductor device according to the second exemplary embodiment of this invention, regarding to the memory cell area A illustrated in FIG. 6. In FIGS. 7 to 10, the same signs are designated to the components similar to those of the semiconductor device 30 according to the second exemplary embodiment illustrated in FIG. 6.

Figure 7:
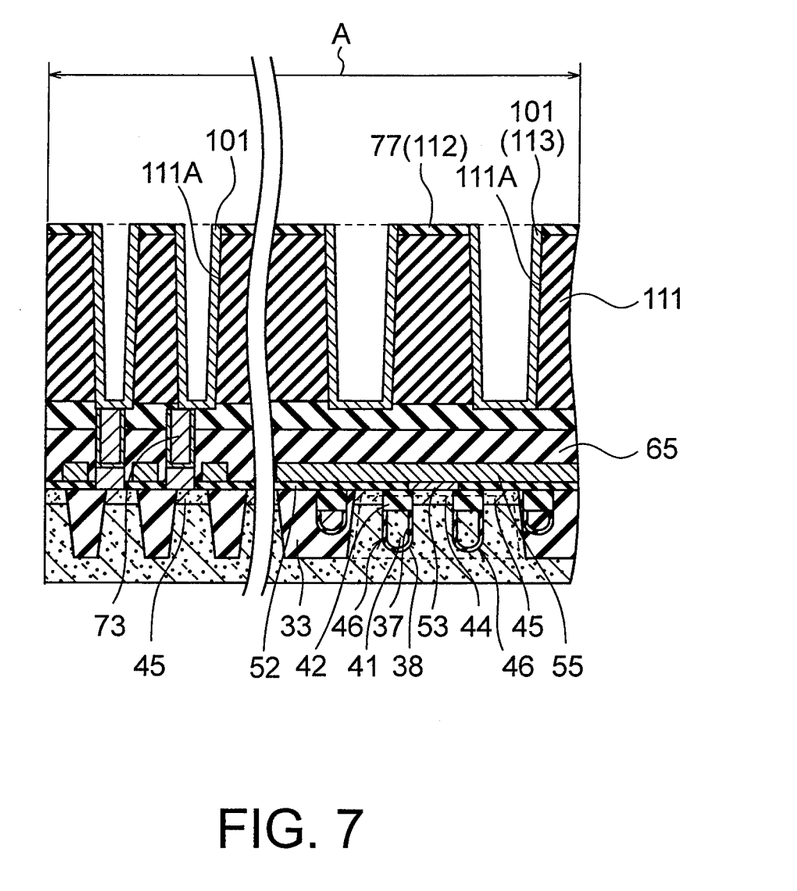
FIG. 7 is a cross sectional view showing a first step of a manufacturing process of the semiconductor device according to the second exemplary embodiment of this invention.

A process illustrated in FIG. 7 first forms the element isolation region 33 and the active region 34 on the p-type monocrystalline silicon substrate 31 by means of a known method. The process illustrated in FIG. 7 forms, by means of a known manner, the memory cell transistor 46 comprising the embedded gate electrode 41 which is embedded in the trench formed in the active region 34 on the silicon substrate 31 and which is formed via the gate insulating film 38, and source and drain regions which comprises the n-type impurity diffused layers 44 and 45 formed in the active region 34 adjacent to the trench. The cap insulating film 42 is embedded on the embedded gate electrode 41. Subsequently, the process illustrated in FIG. 7 forms the bit interlayer insulating film 52 on the silicon substrate 31, makes an opening portion on the n-type impurity diffused layer 44 serving as the source/drain region of the memory cell transistor by means of a known method, and forms a conductive material in the opening portion to form the bit contact 53. Subsequently, the process illustrated in FIG. 7 forms the bit line 55 by means of a known method. The process illustrated in FIG. 7 forms the first interlayer insulating film 57 and the etching stopper film 71 on the bit line 55 in order. Subsequently, the process illustrated in FIG. 7 makes opening portions which penetrate the bit interlayer insulating film 52, the first interlayer insulating film 57, and the etching stopper film 71, and forms a conductive material in the opening portions to form the storage contacts 73.

Next, the process illustrated in FIG. 7 forms an insulating film 111 and a silicon nitride film 112 for forming the support film 77 on the etching stopper film 71 in order. A silicon oxide film is used as the insulating film 111. Subsequently, the process illustrated in FIG. 7 makes cylinder holes 111A which penetrate the insulating film 111 and the silicon nitride film 112 and which are connected to the storage contacts 73.

Next, the process illustrated in FIG. 7 forms the lower electrodes 101 made of titanium nitride in inner walls and bottom portions of the cylinder holes 111A by means of a known method. Although the illustration is not made, the support film 77 formed so as to connect between the lower electrodes 101 is selectively provided with opening portions.

Figure 8:
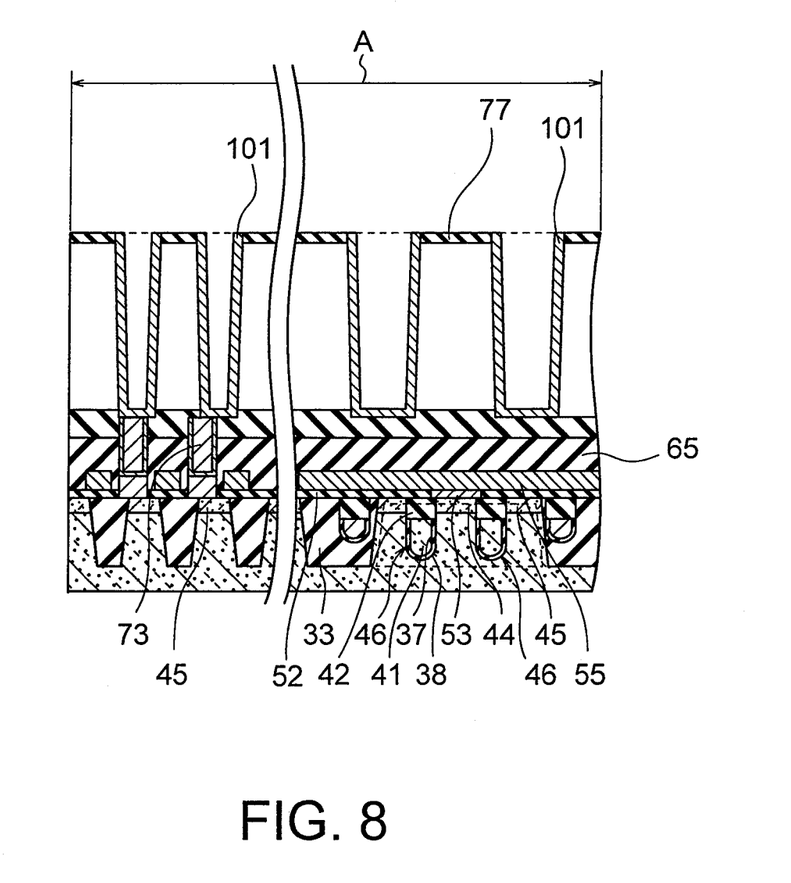
FIG. 8 is a cross sectional view showing a second step of the manufacturing process of the semiconductor device according to the second exemplary embodiment of this invention.

A process illustrated in FIG. 8 removes the insulating film 111 using a wet etching. The insulating film 111 under the support film 77 also is removed because an etching fluid comes around from opening portions (not shown) provided in the support film 77. Hydrogen fluoride water may be used as the etching fluid.

Figure 9:
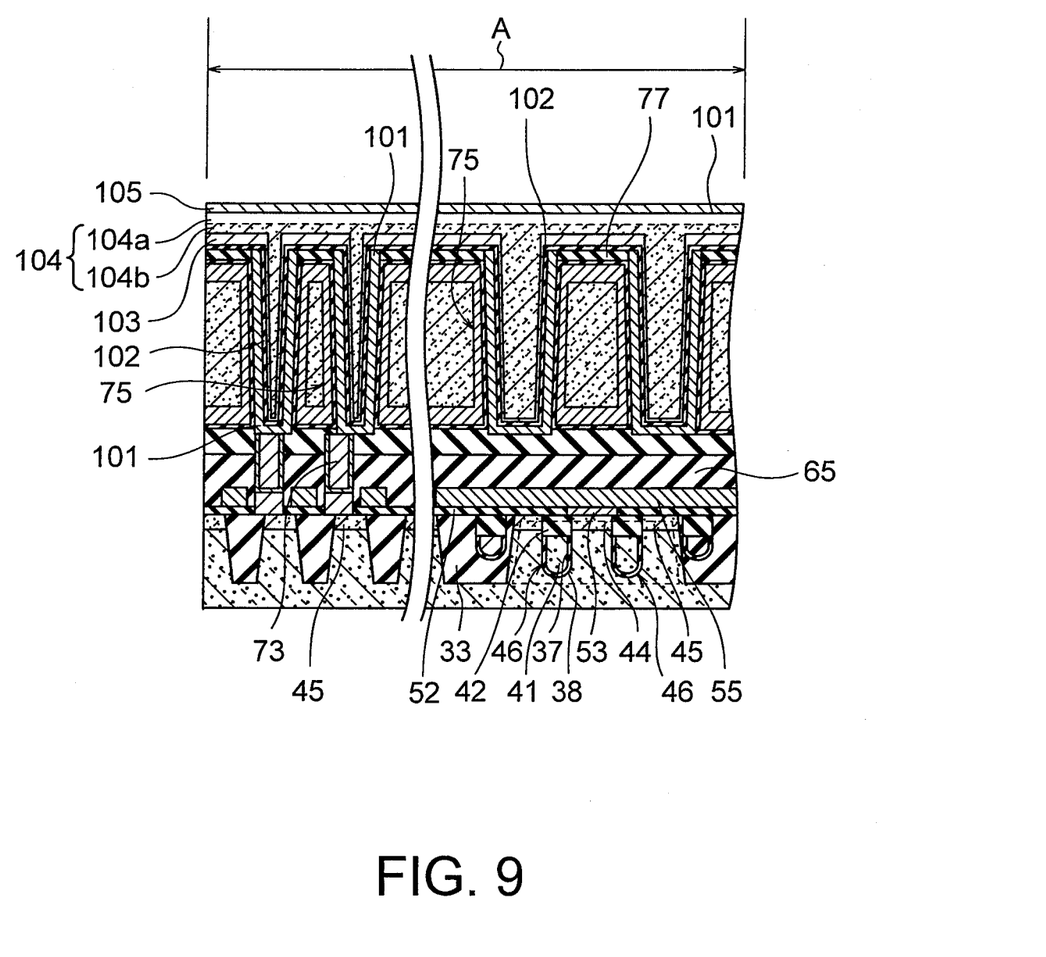
FIG. 9 is a cross sectional view showing a third step of the manufacturing process of the semiconductor device according to the second exemplary embodiment of this invention.

A process illustrated in FIG. 9 forms the dielectric film 102 containing a metallic oxide so as to cover the surface of the lower electrodes 101 exposed. Specifically, the process illustrated in FIG. 9 forms, by means of the vapor deposition method such as the ALD method, the CVD method, or the like, as the dielectric film 102, a single layer film comprising any one selected from a group consisting of a titanium oxide film, a zirconium oxide film, a hafnium oxide film, and an aluminum oxide film or a stacked film comprising at least two selected from them. In this event, the dielectric film 102 also is formed on an exposed surface of the etching stopper film 71 and an upper surface and a lower surface of the support film 77. Subsequently, the process illustrated in FIG. 9 forms the upper electrode 103 made of a metallic material so as to cover a main surface of the dielectric film 102. Titanium nitride is used as the upper electrode.

Next, the process illustrated in FIG. 9 forms the polycrystalline silicon film 104 containing germanium at the deposition temperature of low temperature (e.g. the predetermined temperature within the range between 380° C. and 450° C.).

More specifically, the process illustrated in FIG. 9 forms the polycrystalline silicon film 104 containing germanium by the following conditions and methods by means of, for example, the LP-CVD apparatus.

First, the process illustrated in FIG. 9 loads a semiconductor wafer into a chamber of the LP-CVD apparatus, and therefore holds pressure in the chamber 40 Pa and holds temperature in the chamber 450° C.

Subsequently, the process illustrated in FIG. 9 introduces in the chamber, as process gases, $SiH_4$ (having a flow rate of 787.5 ccm), $BCl_3$ (having a flow rate of 3.15 ccm), and $GeH_4$ (having a flow rate of 735 ccm) to make reaction, thereby deposition of the boron-doped polycrystalline silicon film 104 containing germanium crystallized is started. Normally, an amorphous film is formed under a condition of low temperature and a polycrystalline silicon film cannot be obtained without under a condition of high temperature of 600° C. or more. However, the polycrystalline silicon film can be obtained under a condition of low temperature by setting the flow rate of $GeH_4$ a predetermined value or more. Further, by introducing a gas including boron in the chamber at the same time on depositing the polycrystalline silicon film 104 containing germanium, it is possible to obtain the polycrystalline silicon film with low electrical resistance containing boron activated under the condition of low temperature. In an unpreferable case that impurities are introduced in the polycrystalline silicon film by means of an ion implantation method after forming the polycrystalline silicon film, heat treatment at high temperature for activating the impurities is required in order to make the polycrystalline silicon film with a low resistance.

In addition, the polycrystalline silicon film 104 is filled in the concave portions having the large aspect ratio formed in the main surface of the upper electrode 103 formed inside the lower electrodes 102 of the cylinder-type. Under the circumstances, if voids are formed in the concave portions, cracks often occur in the upper electrode 103 and the lower electrodes 101 by a stress arising from it. In addition, it is undesirable that a leakage current of the dielectric film 102 increases by the stress. Inasmuch as a shape of each lower electrode 101 is preferably a shape so that a width of a plane cross section of the upper end portion of the lower electrode 101 is larger than that of a plane section of the bottom end portion thereof, it is advantageous in that it is possible to avoid forming the voids on filling the above-mentioned concave portions. It is further desirable that the width of the plane cross section of the lower electrode 101 simply increases from the bottom end portion toward the top end portion of the lower electrode. As a result, a main surface of the polycrystalline silicon film 104 over the lower electrodes 101 becomes a substantially flat surface without the fine concave portions.

Subsequently, by controlling the amount of supply of $GeH_4$ (however, supply of $SiH_4$ (having the flow rate of 787.5 ccm) and $BCl_3$ (having the flow rate of 3.15 ccm) continues), it is possible to control the profile of the concentration of germanium of the polycrystalline silicon film 104 containing germanium in a thickness direction. By decreasing the amount of supply of $GeH_4$, it is possible to decrease the concentration of germanium in an upper portion of the polycrystalline silicon film 104 containing germanium. When the supply of $GeH_4$ is stopped, it is possible to make the concentration of germanium in the upper portion of the polycrystalline silicon film 104 0%. Although the amount of supply of $GeH_4$ is changed, it is possible to continuously deposit the polycrystalline silicon film with the low electrical resistance containing activated boron under the condition of low temperature without making amorphous.

By making the manner which is described above, it is possible to form the polycrystalline silicon film with the low electrical resistance containing activated boron without using a process under a condition of high temperature that becomes a cause of degradation of the dielectric film 102, and it is possible to obtain the shape of the substantially flat surface with the polycrystalline silicon film filled in the fine concave portions.

In addition, by setting the thickness of the polycrystalline silicon film 104 to 20 nm or more, it is possible to prevent germanium having high concentration included in the lower portion of the polycrystalline silicon film 104 from thermally diffusing up to proximity to the top surface of the polycrystalline silicon film 104 by heat treatment after forming the polycrystalline silicon film 104.

Subsequently, the process illustrated in FIG. 9 forms the metallic film 105 made of tungsten on the polycrystalline silicon film 104 containing germanium by means of the vapor deposition method (e.g. the CVD method).

It is therefore possible to obtain the structure in which the upper electrode 103 made of the metallic material, the polycrystalline silicon film 104 containing germanium, and the metallic film 105 are stacked on the dielectric film 102 in order.

Figure 10:
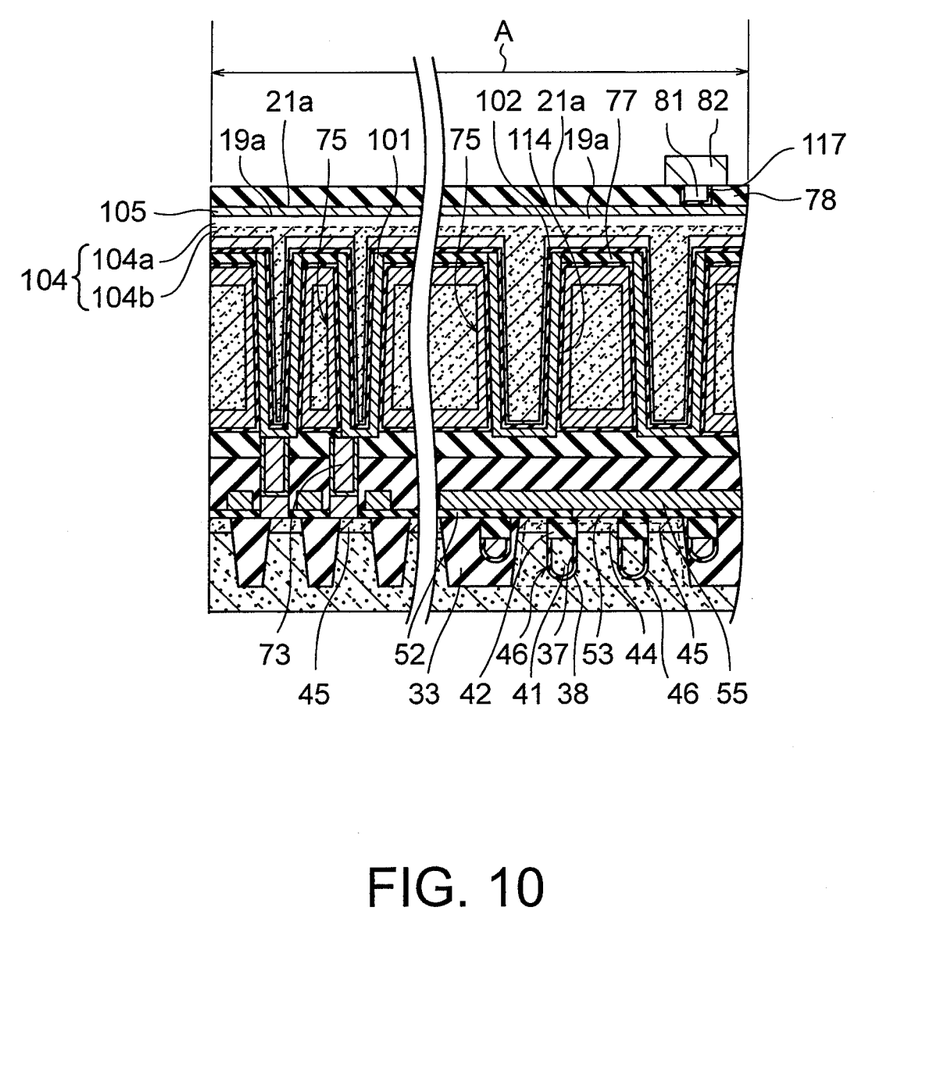
FIG. 10 is a cross sectional view showing a fourth step of the manufacturing process of the semiconductor device according to the second exemplary embodiment of this invention.

Next, a process illustrated in FIG. 10 forms the second interlayer insulating film 78 so as to cover the metallic film 105. The process illustrated in FIG. 10 makes a contact opening portion 117 in the second interlayer insulating film 78 by means of a known method, and forms a conductive material in the contact opening portion 117 to form the third contact plug 81. Furthermore, the process illustrated in FIG. 10 makes the wiring layer 82 made of a conductive material on the second interlayer insulating film 78. The contact plug 81 and the wiring layer 82 may be integrally formed by means of a dual-damascene method. Inasmuch as the polycrystalline silicon film with the low electricaly resistance containing germanium is filled in the concave portions having the large aspect ratio to obtain the substantially flat surface, it is possible to form the contact opening portion 117 over the lower electrodes 101. The contact opening portion 117 made in the second interlayer insulating film 78 may be arranged at any position of the memory cell area A without being limited.

Next, a manufacturing process repeats a process for successively forming an interlayer insulating film, a contact plug, and a wiring layer on the wiring layer 82 by the desired number of times, and is finally covered with a protection film to finish the semiconductor device. Herein, the contact plug and the wiring layer may be integrally formed by means of the dual-damascene method.

According to the manufacturing method of the semiconductor device of the second exemplary embodiment, the semiconductor device can be obtained by forming the upper electrode 103 on the main surface of the dielectric film 102 formed on the main surface of the lower electrodes 101 having the cylinder shape, subsequently by stating forming of the polycrystalline silicon film 104 containing germanium on the main surface of the upper electrode 103 at the deposition temperature of low temperature (the predetermined temperature within the range between 380° C. and 450° C.), subsequently by forming the polycrystalline silicon film 104 with the reduced germanium content by decreasing the amount of supply the gas containing atoms of germanium, and thereafter by forming the metallic film 105 on the upper surface of the polycrystalline silicon film 104. As a result, it is possible to decrease the leakage current of the capacitor 75 by forming the metallic film 105 on the polycrystalline silicon film 104 and it is possible to decease the electrical resistance of the upper electrode 103 at the state where it prevents the metallic film 105 from peeling off the polycrystalline silicon film 104.

In addition, it is possible to improve a data holding property of the capacitor 75 because it is possible to decrease the leakage current of the capacitor 75.

It is possible to prevent the metallic film 105 from peeling off because it is possible to obtain the polycrystalline silicon film 104 having the substantially flat surface so that the polycrystalline silicon film 104 is filled in the fine concave portion. Furthermore, it is possible to provide with the contact plug in the insulating film over the lower electrodes 101.

Figure 11:
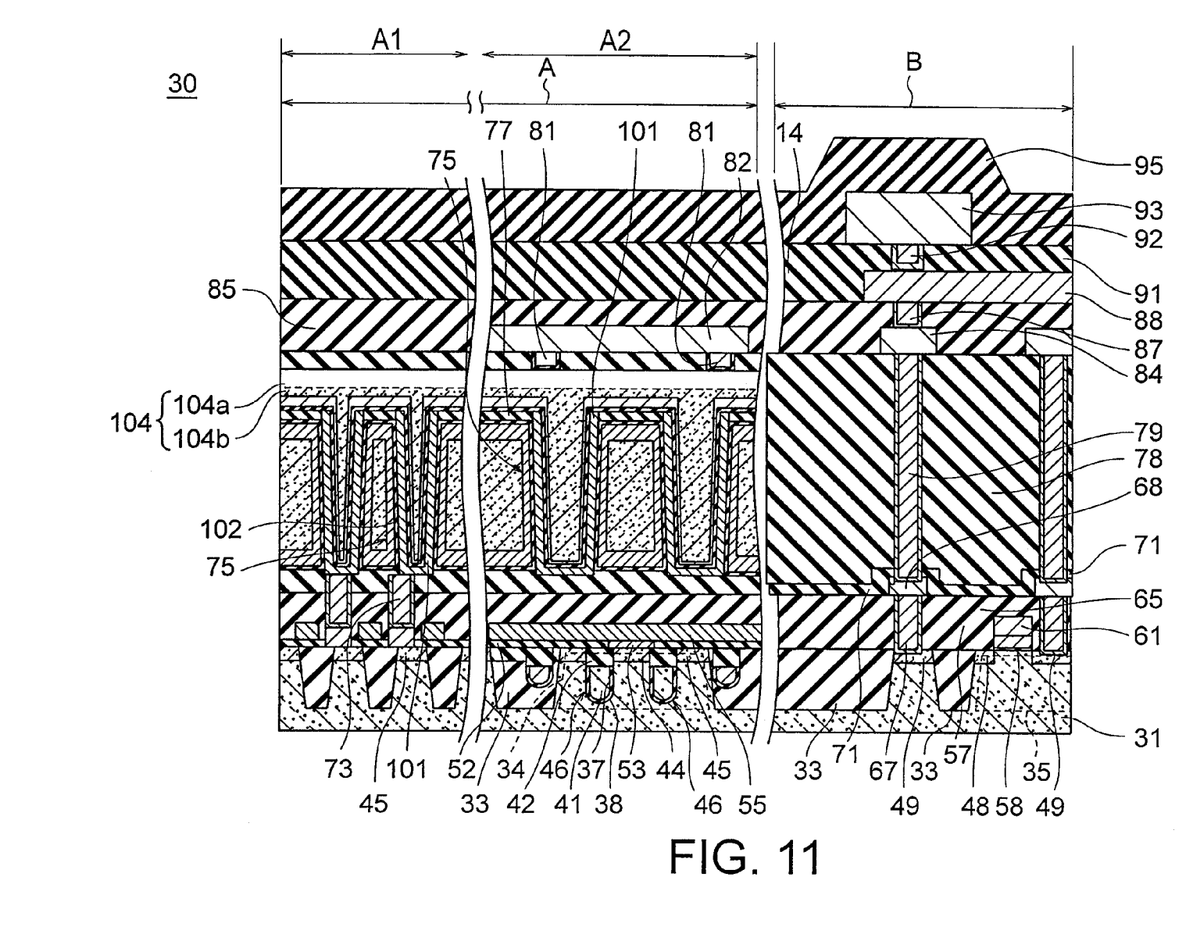
FIG. 11 is a cross sectional view of a modified example of a semiconductor device according to the second exemplary embodiment of this invention.

FIG. 11 shows an modified example of the semiconductor device of the second exemplary embodiment illustrated in FIG. 6.

In FIG. 11, the same signs are designated to components similar to those of the semiconductor device 30 of the second exemplary embodiment illustrated in FIG. 6.

Although the metallic film 105 is formed in the plate-shape so as to cover the polycrystalline silicon film 104 in the semiconductor device of the second exemplary embodiment illustrated in FIG. 6, a plurality of island-like metallic films dispersed to one another may be formed. In the modified example of the semiconductor device 30 of the second exemplary embodiment illustrated in FIG. 11, a plurality of contact plugs 81 made of metallic materials dispersed to one another are formed on the main surface of the polycrystalline silicon film 104 in lieu of the metallic film 105 formed in the plate shape in the semiconductor device of the second exemplary embodiment in FIG. 6. In the manner similar to the semiconductor device of the second exemplary embodiment illustrated in FIG. 6, the polycrystalline silicon film 104 comprises a polycrystalline silicon film containing germanium and boron wherein the germanium content in the upper portion 104a is lower than that in the lower portion 104b. Inasmuch as the polycrystalline silicon film with the low electrical resistance containing germanium is filled in the fine concave portions to obtain the substantially flat surface, it is possible to form the contact plugs 81 over the lower electrodes 101. It is possible to arrange the contact opening portions 117 formed in the second interlayer insulating film 78 at any positions of the memory cell area A without being limited. The plurality of contact plugs 81 are connected by means of the wiring layer 82.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined the claims.

What is claimed is:

1. A semiconductor device comprising:
   a lower electrode formed over a semiconductor substrate;
   a dielectric film formed on the lower electrode;
   an upper electrode formed on the dielectric film;
   a polycrystalline silicon layer formed on the upper electrode; and
   a metallic member contacted with an upper surface of the polycrystalline silicon layer;
   wherein a concentration of germanium in an upper portion of the polycrystalline silicon layer is lower than that in a lower portion of the polycrystalline silicon layer.

2. The semiconductor device as claimed in claim 1, wherein the lower electrode has a cylindrical shape.

3. The semiconductor device as claimed in claim 2, wherein the polycrystalline silicon layer is filled within a concave portion of the upper electrode which is located within a concave portion of the lower electrode.

4. The semiconductor device as claimed in claim 1, wherein the polycrystalline silicon layer has a thickness which is 20 nm or more.

5. The semiconductor device as claimed in claim 1, wherein the polycrystalline silicon layer includes boron.

6. The semiconductor device as claimed in claim 1, wherein the upper electrode includes a metallic film.

7. The semiconductor device as claimed in claim 1, wherein the metallic member is a metallic contact plug which is located over the lower electrode.

8. The semiconductor device as claimed in claim 1, wherein the dielectric film includes a metal oxide film.

9. The semiconductor device as claimed in claim 8, wherein the metal oxide film includes at least one oxide film selected from a group consisting of a titanium oxide film, a zirconium oxide film, a hafnium oxide film, and an aluminum oxide film.

10. The semiconductor device as claimed in claim 1, wherein the metallic member includes tungsten.

11. The semiconductor device as claimed in claim 2, wherein a width of a plane cross section of an upper end portion of the lower electrode is larger than a width of a plane cross section of a bottom end portion thereof.

12. The semiconductor device as claimed in claim 2, wherein a width of a plane cross section of the lower electrode simply increased from a bottom end portion of the lower electrode towards a top end portion of the lower electrode.

13. The semiconductor device as claimed in claim 12, wherein the metallic member is a metallic contact plug which is located over the lower electrode.

14. A semiconductor device comprising:
- a cylindrical lower electrode formed over a semiconductor substrate;
- a dielectric film formed on the cylindrical lower electrode;
- an upper electrode formed on the dielectric electrode;
- a polycrystalline silicon layer which is laminated on the upper electrode; and
- a metallic contact plug which is located over the cylindrical lower electrode and which electrically connects the upper electrode to a metal wiring layer,
- wherein a concentration of germanium in an upper portion of the polycrystalline silicon layer is lower than that in a lower portion of the polycrystalline silicon layer.

15. The semiconductor device as claimed in claim 14, wherein the upper electrode includes a metal film.

16. The semiconductor device as claimed in claim 14, wherein the dielectric film includes a metal oxide film.

17. The semiconductor device as claimed in claim 16, wherein the metal oxide film includes at least one oxide film selected from a group consisting of a titanium oxide film, a zirconium oxide film, a hafnium oxide film, and an aluminum oxide film.

18. The semiconductor device as claimed in claim 14, wherein the metallic contact plug includes tungsten.

19. The semiconductor device as claimed in claim 14,
wherein a width of a plane cross section of an upper end portion of the lower electrode is larger than a width of a plane cross section of a bottom end portion thereof.

20. The semiconductor device as claimed in claim 14, wherein a width of a plane cross section of the lower electrode simply increased from a bottom end portion of the lower electrode towards a top end portion of the lower electrode.

* * * * *